United States Patent [19]

Harada et al.

[11] Patent Number: 4,785,426
[45] Date of Patent: Nov. 15, 1988

[54] SUPERCONDUCTING SWITCHING CIRCUIT, MEMORY CELL AND MEMORY CIRCUIT, WITH RESONANCE DAMPING RESISTORS

[75] Inventors: Yutaka Harada, Kodaira; Ushio Kawabe, Tokyo; Eiichi Goto, Fujisawa; Nobuo Miyamoto, Hachioji, all of Japan

[73] Assignees: Hitachi, Ltd.; Rikagaku Kenkyusho, both of Tokyo, Japan

[21] Appl. No.: 777,585

[22] Filed: Sep. 19, 1985

[30] Foreign Application Priority Data

Sep. 21, 1984 [JP] Japan ................... 59-196680
Mar. 8, 1985 [JP] Japan ................... 60-44802

[51] Int. Cl.$^4$ .......................................... G11C 11/44
[52] U.S. Cl. ................................. 365/162; 307/306
[58] Field of Search ............ 365/162; 307/277, 306, 307/462, 476

[56] References Cited

U.S. PATENT DOCUMENTS 4,012,646 3/1977 Fang ........................... 307/306

Primary Examiner—James W. Moffitt
Attorney, Agent, or Firm—Antonelli, Terry & Wands

[57] ABSTRACT

A superconducting switching circuit comprises a DCFP circuit composed of two Josephson junction elements constituting two current paths, respectively. Each of the current paths includes a resistor for suppressing resonance. A memory cell constituted by the DCFP circuit includes three Josephson junction elements constituting three current paths, respectively. Each of the current paths includes a resistor for suppressing resonance. A memory circuit comprises a number of memory cells of such a structure.

16 Claims, 10 Drawing Sheets

SUPERCONDUCTING SWITCHING CIRCUIT, MEMORY CELL AND MEMORY CIRCUIT, WITH RESONANCE DAMPING RESISTORS

BACKGROUND OF THE INVENTION

The present invention relates generally to a superconducting circuit incorporating Josephson devices, and more particularly to a DC flux parametron circuit and a memory cell as well as a memory circuit in which makes use of the superconducting circuit.

A switching circuit based on the Josephson effect has been well known in the art, as typically exemplified by a quantum interference circuit and a direct coupled circuit or the like. The quantum interference circuit is a switching circuit constituted by employing superconducting loops including two or more Josephson junctions. For particulars, reference may be made to "IBM Research and Development" Vol. 24, No. 2 (1980) and Japanese unexamined patent application laid-open No. 12965/1979. The direct coupled circuit is a non-quantum interference device in which current is injected at the Josephson junction. As a typical type of direct coupled circuit, there can be mentioned a direct coupled logic circuit (DCL circuit in abbreviation), details of which are disclosed in "International Electron Device Meeting, Technical Digest" (1979). The prior art switching circuits employing the Josephson devices are disadvantageous in that the gain is as low as about 2 (two). Further, because of the necessity to maintain constant a bias current flow in the circuit, power consumption per unity circuit amounts to ca. 1 to 10 $\mu$W. The Josephson device is inherently destined for operation under cryogenic conditions and is ordinarily used in the stage immersed in liquid helium. In consideration of heat of vaporization of liquid helium, the power consumption of 1 to 10 $\mu$W per unity circuit means a great amount of heat generation, providing difficulty and obstacle in implementing logic circuits and systems of a high integration density by using the Josephson devices according to the prior art techniques, which is a disadvantage.

In the case of the quantum interference circuit mentioned above, a single superconducting loop is composed of two Josephson junctions and an inductor. Consequently, resonance circuits are formed by junction capacitances of the two Josephson junctions and the inductor, giving rise to a problem that may result in erroneous operation because of the resonance effect. In conjunction with this, the aforementioned literature "IBM Research and Development", Vol. 24, No. 2 (1980) and Japanese unexamined patent application laid-open No. 12696/1979 teach connecting a resistor to the inductance element forming a part of the resonance circuit for the purpose of suppressing the resonance.

Further, as a switching device based on the Josephson effect which exhibits a high gain and a reduced power consumption, there has been porposed a DC flux parametron circuit (also referred to as DCFP circuit in abbreviation). The principle of the DCFP circuit is disclosed in detail in a literature titled "Josephson Electronics", pp. 1-3, a collection of lectures in symposium held by the Institute of Physics and Chemical Research on Mar. 16, 1984 in Japan and Japanese unexamined patent application laid-open No. 14342/1984. These references are incorporated herein by reference.

The DCFP circuit is excellent in performance over the prior art quantum interference circuit in that the power consumption of the former is extremely low, typically on the order of 1/1000 of that of the latter, and that the former can assure a switching speed of less than 10 ps. The DCFP circuit can enjoy remarkably wide range of applications such as those corresponding to logic circuits and memory circuits. An application of the DCFP to a memory cell is disclosed in Goto et al's article contained in the aforementioned literature "Josephson Electronics" pp. 96-102. This reference is also incorporated herein by reference. It should however be mentioned that the switching circuit constituted by the DCFP circuit is also composed of two Josephson junctions and an inductor. As a consequence, the junction capacitances of the two Josephson junctions cooperate with the inductor to form two resonance circuits whose resonances can effect in erroneous operation, which is a disadvantage. Similarly, in the case of the memory cell constituted by using the DCFP circuit, there are formed three resonance circuits for the three Josephson elements, respectively, wherein resonances of these circuits may effect in erroneous operation of the memory cell.

SUMMARY OF THE INVENTION

It is an object of the present invention to provide a DCFP circuit capable of operating stably and which is free of the conditions leading to to erroneous operation since the resonance phenomenon is suppressed.

Another object of the invention is to provide a DCFP circuit which can enjoy a stable operation with a high gain in response to a very low or weak level input signal.

Still another object of the present invention is to provide a memory cell constituted by a DCFP circuit whose resonance phenomenon is effectively suppressed.

A further object of the present invention is to provide a memory circuit composed of a matrix-like array of plural memory cells each constituted by the DCFP circuit and which is immune to the resonance phenomenon.

In view of the above objects, it is proposed according to a general aspect of the invention that a resistor be inserted in each of two current paths including two Josephson elements, respectively, so as to constitute a DCFP circuit, for the purpose of suppressing resonance which would otherwise take place in each of the current paths. According to another aspect of the present invention it is proposed that a resistor be inserted in each of three current paths including three Josephson elements, respectively, so as to constitute a memory cell including the DCFP circuit, for the purpose of suppressing resonance which might otherwise occur in each of the current paths.

DESCRIPTION OF THE PREFERRED EMBODIMENTS

Figure 1:
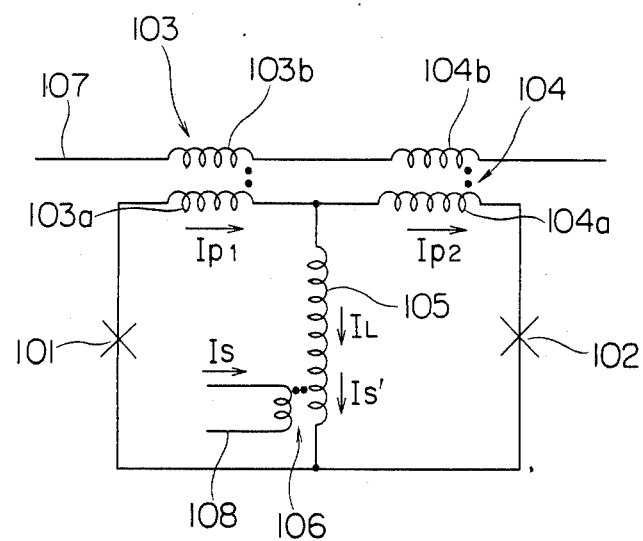
FIG. 1 is a circuit diagram of a hitherto known DC flux parametron (DCFP) circuit.
Figure 2:
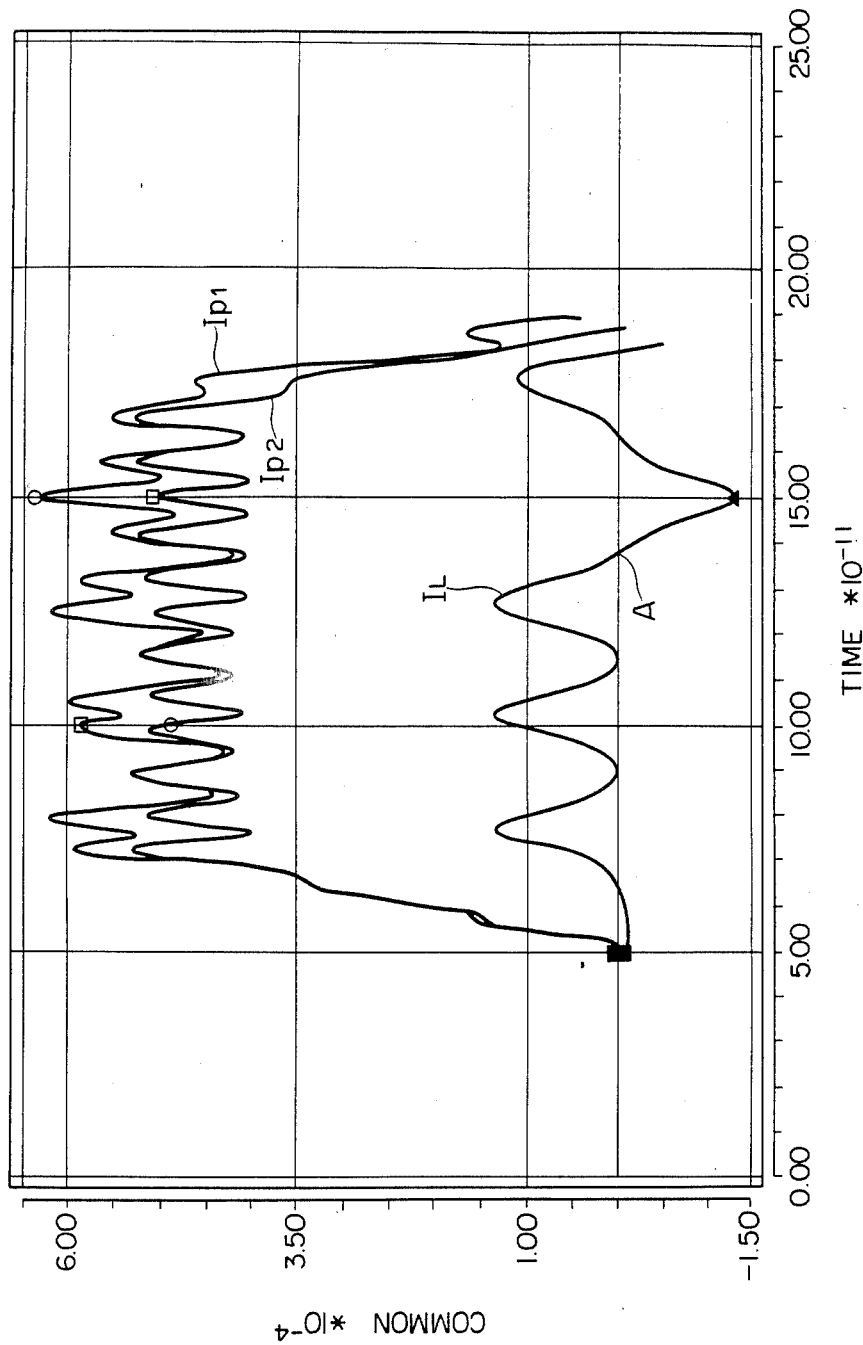
FIG. 2 is a view for illustrating the experimental results obtained by simulating operation of the circuit shown in FIG. 1.
Figure 3:
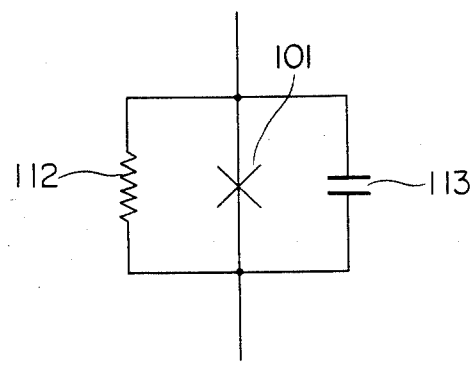
FIG. 3 is an equivalent circuit diagram of a Josephson junction.

FIG. 1 shows a basic circuit arrangement of the hitherto known DC flux parametron or DCFP circuit. Referring to the figure, the DCFP circuit includes a first superconducting loop which is composed of a first Josephson junction 101, a first excitation inductor 103a and a load inductor 105 and a second superconducting loop which includes a second Josephson junction 102, a second excitation inductor 104a and the load inductor 105. The load inductor 105 is shared by the first and second superconducting loops which thus exert influence to each other by way of the load inductor 105. In other words, the DCFP circuit shown in FIG. 1 is realized in the form of a bistable circuit including a positive feedback path. The first and second excitation inductors 103a and 104a are magnetically coupled to exciting inductors 103b and 104b, respectively, to form transformers 103 and 104, respectively. The DCFP circuit is driven through the transformers 103 and 104 by a source current fed by an exciting conductor 107 and flowing through the exciting inductors 103b and 104b. A part (or the whole) of load inductor 105 is magnetically coupled with an input signal line or winding 108 to thereby constitute a transformer 106. Operation of the DCFP circuit will be described below. Upon application of a low or weak level input signal current $I_s$ to the input signal winding 108, a low or weak current $I'_s$ corresponding to the input signal current $I_s$ is caused to flow through the load inductor 105 by way of the transformer 106. When the DCFP circuit is driven starting from this state through the exciting line 107, the two source inductors 103b and 104b and the excitation inductors 103a and 104a, the state of the DCFP circuit is switched to one of the two stable states in dependence on the polarity of the low or weak input current $I_s$. The load current $I_L$ flowing through the load inductor 105 corresponds to the difference between currents $I_{p1}$ and $I_{p2}$ flowing through the excitation inductors 103a and 104a, respectively. The load current $I_L$ is determined by the low or weak level input signal current $I_s$, because the currents $I_{p1}$ and $I_{p2}$ flowing through the excitation inductors 103a and 104a, respectively, are of a same polarity, wherein relative magnitudes of the currents $I_{p1}$ and $I_{p2}$ are determined in dependence on the polarity of the input signal current $I_s$. In general, the load current $I_L$ can be made larger than the low or weak input current $I_s$. Consequently, it is not theoretically difficult to realize the gain of the DCFP circuit to be more than 10 (ten). FIG. 2 illustrates the experimental results obtained by simulating the operation of the DCFP circuit shown in FIG. 2 on the assumption that the excitation inductors 103a and 104a are of 1.8 pH and the load inductor 105 is of 5.5 pH. An equivalent circuit of a Josephson junction 101 or 102 is shown in FIG. 3. As will be seen in FIG. 3, the equivalent circuit can be considered as being composed of a Josephson junction 101, a junction capacitance 113 and a resistor 112 connected in parallel to one another. It is assumed that the maximum supercurrent in the Josephson junction 110 is of 50 μA and that the junction capacitance 113 is of 1 pF. In the circuit configuration shown in FIG. 1, the first superconducting loop composed of the junction capacitance of the first Josephson junction 101, the first excitation inductor 103a and the load inductor 105 on one hand and the second superconducting loop composed of the second Josephson junction 102, the second excitation inductor 104a and the load inductor 105 on the other hand constitute resonance circuits, respectively. As a consequence, an oscillating waveform as a result of the resonance phenomenon becomes evident in the load current $I_L$. In FIG. 2, oscillation above the zero level is illustrated. In conjunction with this, it should be mentioned that in the DCFP circuit, the low or weak level input signal current $I'_s$ flows concurrently with the load current $I_L$ in the mixed state. Accordingly, the oscillating waveform appearing in the load current $I_L$ may vary in the same direction as the input signal, involving polarity inversion of the load current $I_L$ and thus giving rise to erroneous operation. In the case of the illustrative simulation shown in FIG. 2, the polarity of the load current is inverted downstream of a point A as a result of the oscillation being of significant magnitude, whereby the waveform produced corresponding to the load circuit is below the zero level, thereby resulting in erroneous operation. An attempt to prevent such an erroneous operation from occurring, measures may be taken such that the polarity of the load current is protected from inversion notwithstanding the occurrence of oscillation as a result of an increasing input signal. However, with such measures, high gain can not be obtained.

Figure 4:
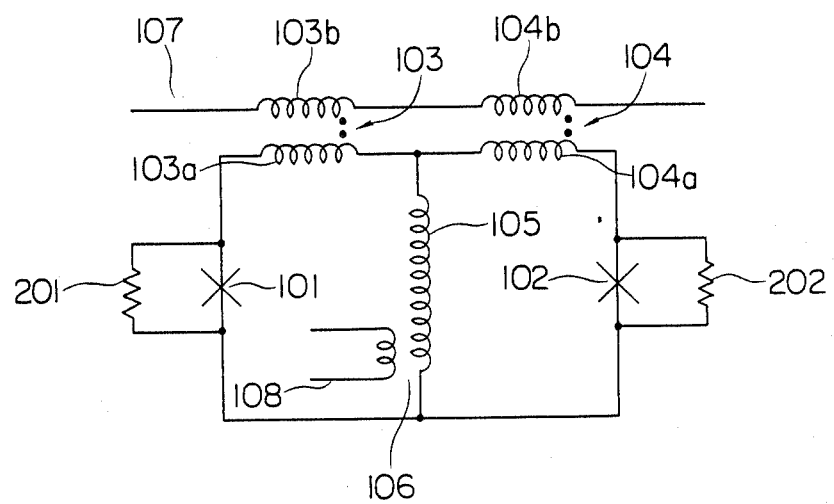
FIG. 4 is a circuit diagram showing a DCFP circuit according to a first exemplary embodiment of the present invention.
Figure 5:
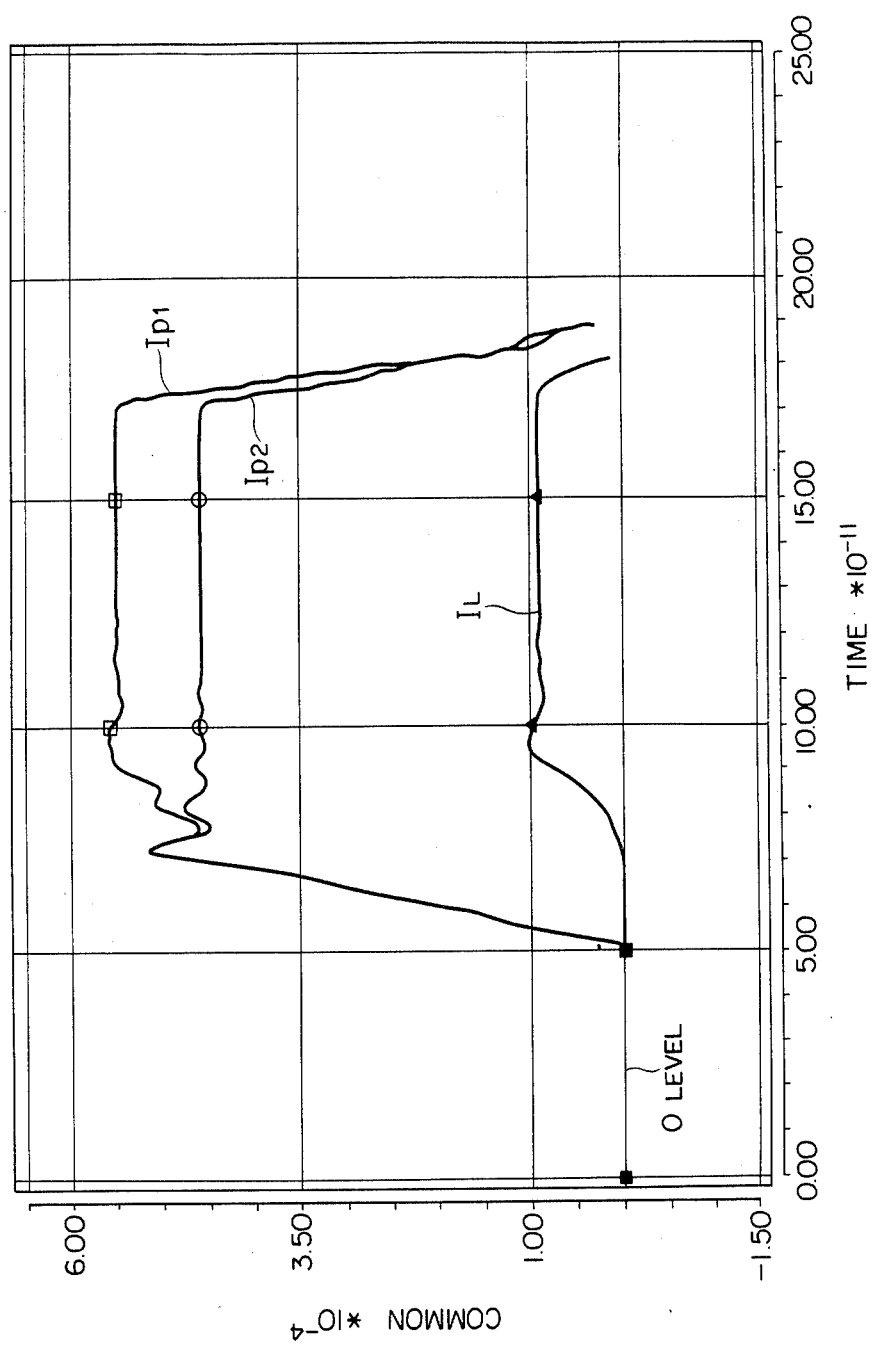
FIG. 5 is a view illustrating the experimental results obtained by simulating operation of the DCFP circuit shown in FIG. 4.

FIG. 4 shows a DCFP circuit according to a first embodiment of the invention. Referring to the figure, first and second damping resistors 201 and 202 are connected in parallel with first and second Josephson junctions 101 and 102, respectively, for suppressing the resonance phenomenon. The resistance of the damping resistor may be selected at value approximating the critical damping. That is, $$R_a \approx \sqrt{L/C}$$

where L represents a sum of inductances of the excitation inductor 103a or 104a and the load inductor 105, and C represents junction capacity of the Josephson junction 101 or 102. FIG. 5 illustrates the results obtained by simulating the operation of the DCFP circuit shown in FIG. 4 on the assumption that the resistance $R_a$ of the damping resistors 201 and 202 is 5Ω, which is greater than the critical damping corresponding to the resistance value $R_a$ of 3Ω. This is for the purpose of realizing the high speed circuit operation. As will be seen from comparison with the waveform shown in FIG. 2, the oscillation phenomenon due to resonance is effectively suppressed in the pulse waveform shown in FIG. 5, thereby avoiding erroneous operation.

Figure 6:
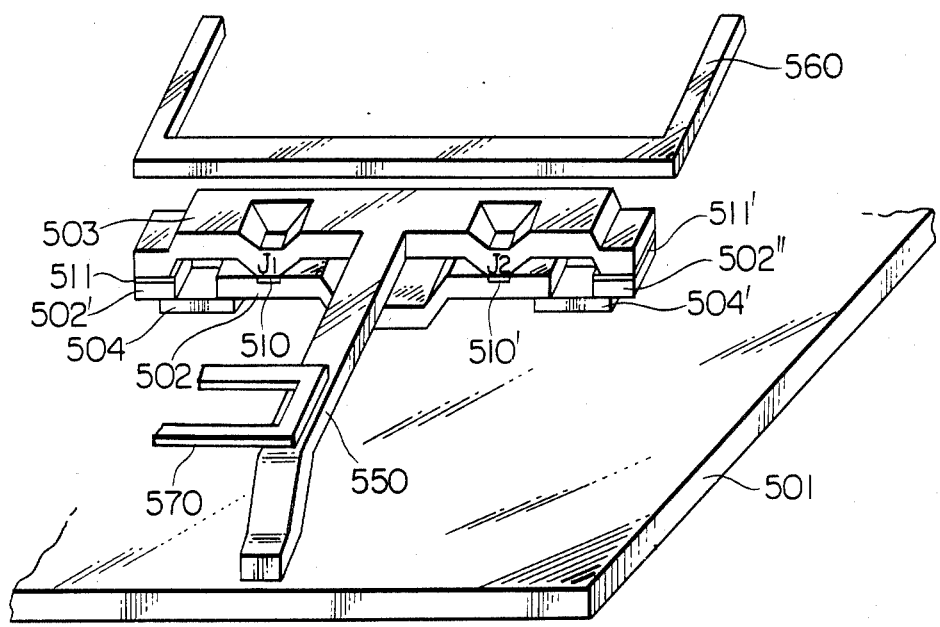
FIG. 6 is a view illustrating schematically a geometrical structure of the DCFP circuit shown in FIG. 4.

FIG. 6 shows a structure of the DCFP circuit shown in FIG. 4, by way of example. In FIG. 6, a reference numeral 501 denotes a ground plane layer, numerals 502, 502' and 502" denote first, second and third base electrode layers, respectively, 503 denotes a counter electrode layer, and 504 and 504' denote first and second resistive electrode layers for resistors, respectively. All of the layers and electrode mentioned above are formed of metal thin films. Numerals 510, 510', 511 and 511' denote insulating thin films forming barrier layers of Josephson junctions, respectively. It should be noted that inter-electrode insulating films are omitted for simplification of illustration. The ground plane layer defines a grounding layer of the circuit and at the same time serves as a magnetic shielding layer. The Josephson junction element (101, 102) shown in FIG. 4 is realized in a structure in which the first base electrode layer 502 is disposed in opposition to the counter electrode layer with the barrier layer film (510 or 510') being interposed therebetween. The excitation inductors 103a, 104a and the load inductor 105 are realized by a wiring conductor 550 including the counter electrode layer 503. The exciting line 107 is realized by a wiring conductor 560. The excitation inductors 103b and 104b are also realized by this wiring conductor. The input signal line 108 is realized by a wiring conductor 570. The wiring conductor 560 is disposed over the counter electrode layer 503, the Josephson junctions 510, 510' and the base electrode layer 502. The insulation thin films 510 and 510' for the first and second barrier layers are dimensioned so as to allow the current not greater than the maximum superconducting current to flow therethrough, while the insulation thin films 511 and 511' for the third and fourth barrier layers are dimensioned to allow the current not smaller than the maximum superconducting current to flow therethrough. To this end, the counter electrode layer 503 and the second and third base electrode layers 502' and 502" are short-circuited to each other. The first base electrode 502 and the second and third base electrodes 502' and 502" are partially disposed on the resistive electrode layer 504 and 504', respectively. The resistive electrode layers 504 and 504' serve as the resistors 201 and 202 shown in FIG. 4. By inserting the damping resistors in the manner shown in FIG. 4, the parasitic inductance remains small, whereby the damping effect can be increased effectively in the DCFP circuit. Further, because the Josephson junction elements 510 and 510' are stacked on the resistive electrode layers 504 and 504', respectively, the circuit structure can be realized in a small size.

Figure 7:
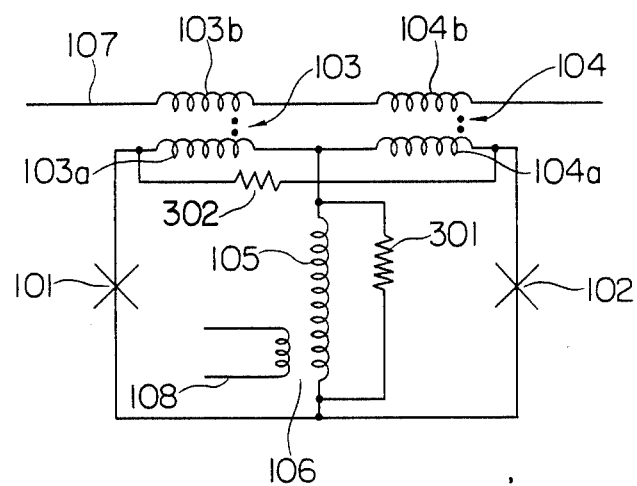
FIG. 7 is a circuit diagram of a DCFP circuit according to a second exemplary embodiment of the invention.

FIG. 7 shows a DCFP circuit according to a second embodiment of the invention. In the DCFP circuit, the load inductor 105 has a greater inductance value than the excitation inductors 103a and 104a. Accordingly, it is apparent that the resonance phenomenon can be suppressed by inserting a damping resistor 301 in parallel with the load inductor 105 and inserting additionally a damping resistor 302 in parallel with the whole (or a part) of the excitation inductors 103a and 104a, as shown in FIG. 7. The value of the resistor 302 is so selected that the resonance is prevented from occurring in the loop including the Josephson elements 101 and 102 and the excitation inductors 103a and 104a, while the resistance value of the resistors 301 is so selected as to prevent resonance from occurring in the loop including the Josephson element 102, the excitation inductor 104a and the load inductor 105.

Figure 8:
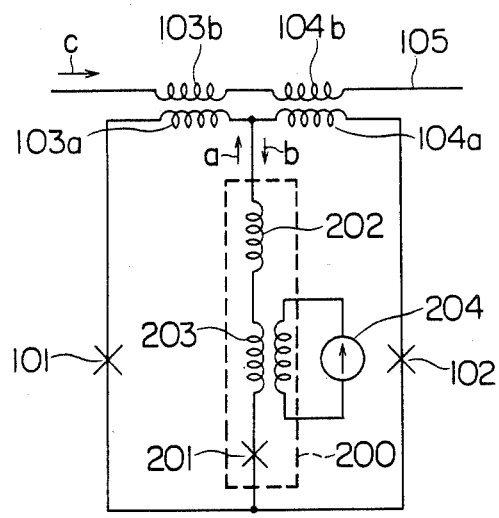
FIG. 8 is a circuit diagram of a conventional memory cell realized by using the prior art DCFP circuit.

Before entering into description of the memory cell constituted by using the DCFP circuit according to the invention, a hitherto known memory cell constituted by a conventional DCFP circuit will be reviewed by referring to FIG. 8. The illustrated memory cell is composed of a DCFP circuit constituted by two loops each having a Josephson junction element (101 or 102) and an inductor (103a or 104a) connected in series to each other, and a load circuit composed of a Josephson junction element 201, inductors 202 and 203 connected in series to one another, wherein the inductor 203 and a constant current source 204 constitute a DC bias current supply source.

The load circuit 200 is in the form of a quantum interference circuit (rf-SQUID), wherein the current value of the stable current source 204 is so set that magnetic flux interlinking the load circuit 200 through the inductor 203 is a half of the quantum flux (i.e. $\pi$ in terms of the flux phase angle). Then, by selecting properly the value of the inductor 202 in the circuit shown in FIG. 8, a current continues to flow through the quantum interference circuit 200 in the direction determined in dependence on the direction of the magnetic flux applied externally, whereby memory function is realized. Information as stored can be discriminatively identified by the direction a or b of the current flowing relative to the quantum interference circuit 200. External application of magnetic flux which determines the direction of the current flowing through the quantum interference circuit 200 is effected through the inductor 202 or through other inductor (not shown).

The DCFP circuit serves as a sense amplifier of the quantum interference circuit. Upon feeding of a current through a select line 105 in the direction indicated by an arrow c, the current flowing through the Josephson junction element 102 is increased when the current flowing through the quantum interference circuit 200 is in the direction indicated by a, whereby the Josephson junction element 102 assumes the voltage-applied state. On the other hand, when the current flows through the quantum interference circuit 200 in the direction indicated by the arrow b, the current flowing through the Josephson junction element 101 is increased, whereby the Josephson junction element 101 assumes the voltage-applied state. As the result, a current of great magnitude excited by the current flowing through the select line 105 will flow in the direction a or b.

Reading or writing of information in or from the memory cell is realized by providing a data line coupled magnetically to the inductor 202.

Upon information reading operation, a current is fed to the select line 105 to excite or drive the DCFP circuit through the source inductors 103b; 104b and the excitation inductors 103a; 104a, to thereby increase the magnetic flux of the inductor 202 for allowing information to be read by way of the data line.

Upon information writing operation, no current is fed to the select line 105, wherein information to be written is supplied to the data line in terms of the direction of the current flow. Thus, information is stored in the quantum interference circuit 200. The memory cell using the DCFP circuit of the prior art described above suffers a disadvantage that resonance will take place upon switching operation due to the inclusion of the inductors and the Josephson junctions, providing a cause for erroneous operation of the memory cell. Another disadvantage can be seen in the fact that because of the serial connection of the inductors 202; 203 and the Josephson junction 201, the load circuit 200 exhibits a large impedance, making it impractical to obtain a large output current from the memory cell.

Figure 9:
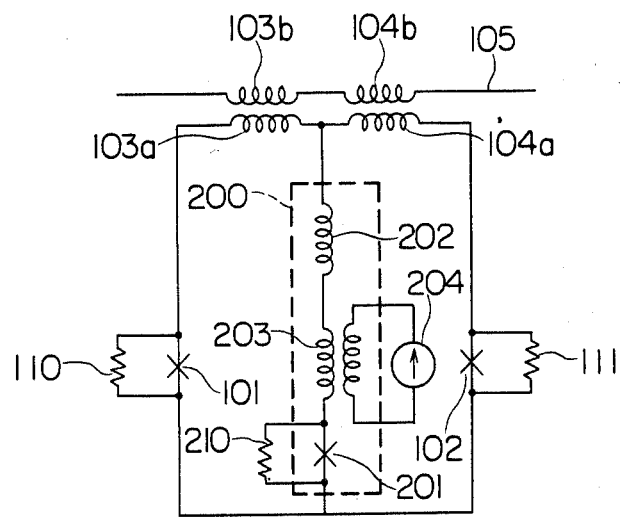
FIG. 9 is a circuit diagram showing a memory cell according to an exemplary embodiment of the invention.

FIG. 9 shows a memory cell according to an embodiment of the present invention. In FIG. 9, same components as those shown in FIG. 8 are denoted by like reference symbols. In the case of the memory cell shown in FIG. 9, the damping resistors 110, 111 and 210 are connected in parallel with three Josephson junction elements 101, 102 and 201, respectively. The resistors 110, 111 and 210 are so dimensioned that resonance is prevented from occurring, respectively, in a first current path including the Josephson junction element 101, the excitation inductor 103 and the quantum interference circuit 200, a second current path including the Josephson junction element 111, the excitation inductor 104a and the quantum interference circuit 200, and a third current path short-circuiting both ends of the quantum interference circuit. By virtue of the three damping resistors connected in the manner mentioned above, resonance energy can be dissipated to suppress the oscillation phenomenon.

Figure 10:
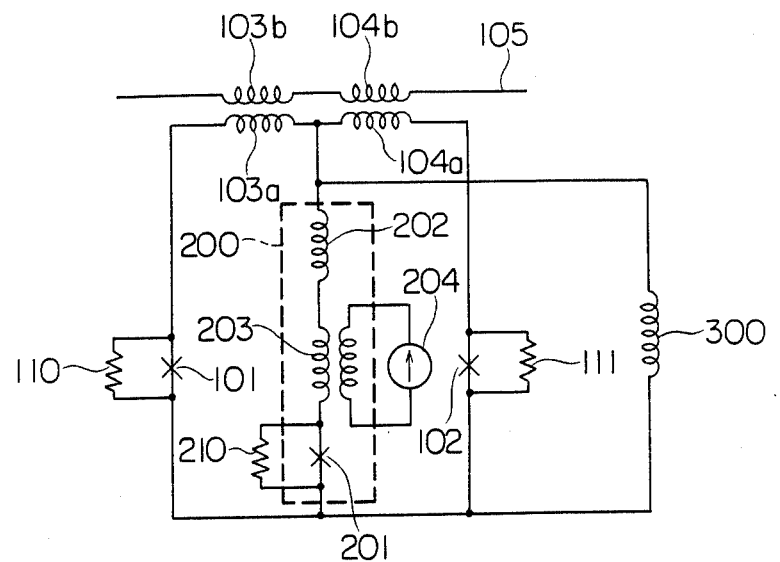
FIG. 10 is a circuit diagram showing a memory cell according to another embodiment of the invention.

FIG. 10 shows a memory cell according to another embodiment of the present invention. In FIG. 10, the same circuit components as those shown in FIG. 9 are denoted by like reference symbols. The memory cell shown in FIG. 10 differs from the one shown in FIG. 9 in that a load inductor 300 is additionally connected in parallel with the quantum interference circuit 200. With this circuit configuration, the load impedance of the DCFP circuit as a whole can be decreased, whereby the output current can be increased. Further, the quantum interference circuit 200 performs the memory operation, wherein memory information amplified through excitation of the DCFP circuit is taken out through the load inductor 300. Further, writing operation is made through the load inductor 300 in the state where the DCFP circuit is not excited.

Figure 11:
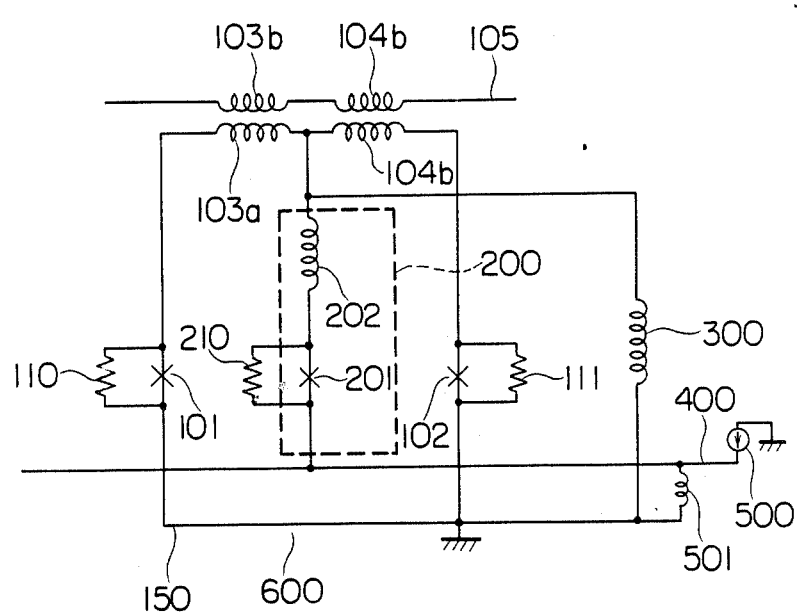
FIG. 11 is a circuit diagram showing a memory cell according to sill another embodiment of the invention.

FIG. 11 shows a memory cell according to still another embodiment of the invention. In FIG. 11, the same components as those shown in FIG. 10 are denoted by like reference numerals. In the memory cell shown in FIG. 11, the DC bias current source (inductor 203 and the constant current source 204) shown in FIG. 10 is replaced by a DC bias current source 500 supplying a current such that phase difference of magnetic fluxes produced at both ends of the quantum interference circuit 200 is equal to $\pi$, in combination with a phase conductor 400 and an inductor 501, wherein a quantum interference circuit 200' is connected to the phase conductor 400. This conductor 400 is further connected to the quantum interference circuit of other memory cell or cells not shown so that the DC bias current source 500 is shared among a number of the memory cells. In a memory circuit comprising a plurality of the memory cells each of the configuration shown in FIG. 11, the memory cells are arrayed in a matrix with the phase conductor 400 being connected in common to all the memory cells. In that case, the phase conductor 400 is realized in a plane layer with a view to decreasing the inductance.

Figure 12:
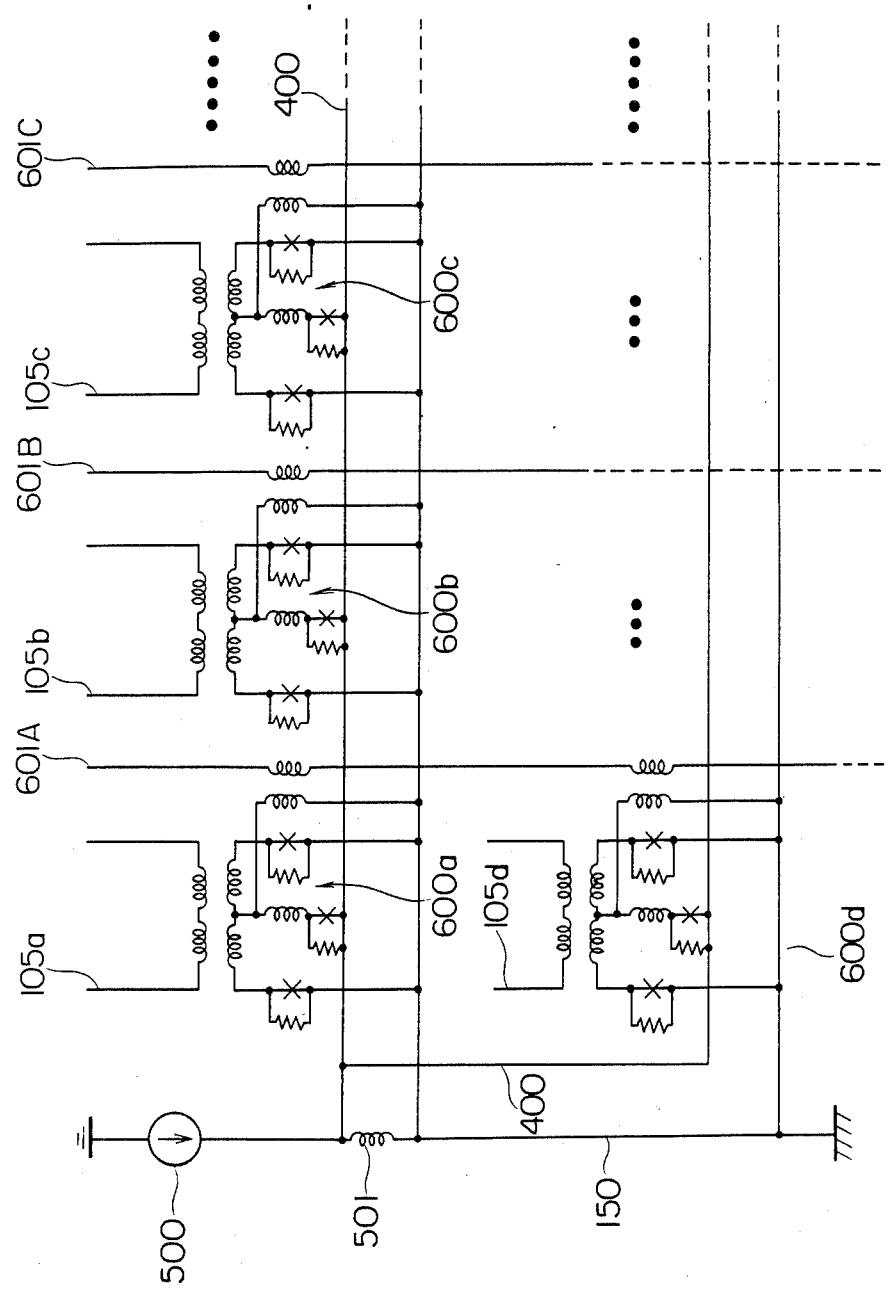
FIG. 12 is a circuit diagram showing a memory circuit according to a further embodiment of the invention in which the memory cells of the configuration shown in FIG. 11 are employed.

FIG. 12 shows a superconducting memory circuit comprising a plurality of memory cells each constituted by the memory cell 600 shown in FIG. 11. Referring to FIG. 12, the memory cells denoted by 600a, 600b, 600c and 600d, respectively, are disposed in a matrix-like array. Each of the memory cells is connected to a base conductor 150 and the phase conductor 400 which in turn are connected to each other through a phase inductor 501 adapted to be supplied with a constant current from the constant current supply source 500. The value of the constant current supplied from the source 500 is so determined that the phase difference between the phase conductor 400 and the base conductor 150 is equal to $\pi$. The output currents of the individual memory cells are read out through bit lines 601A, 601B, 601C and so forth.

Figure 13:
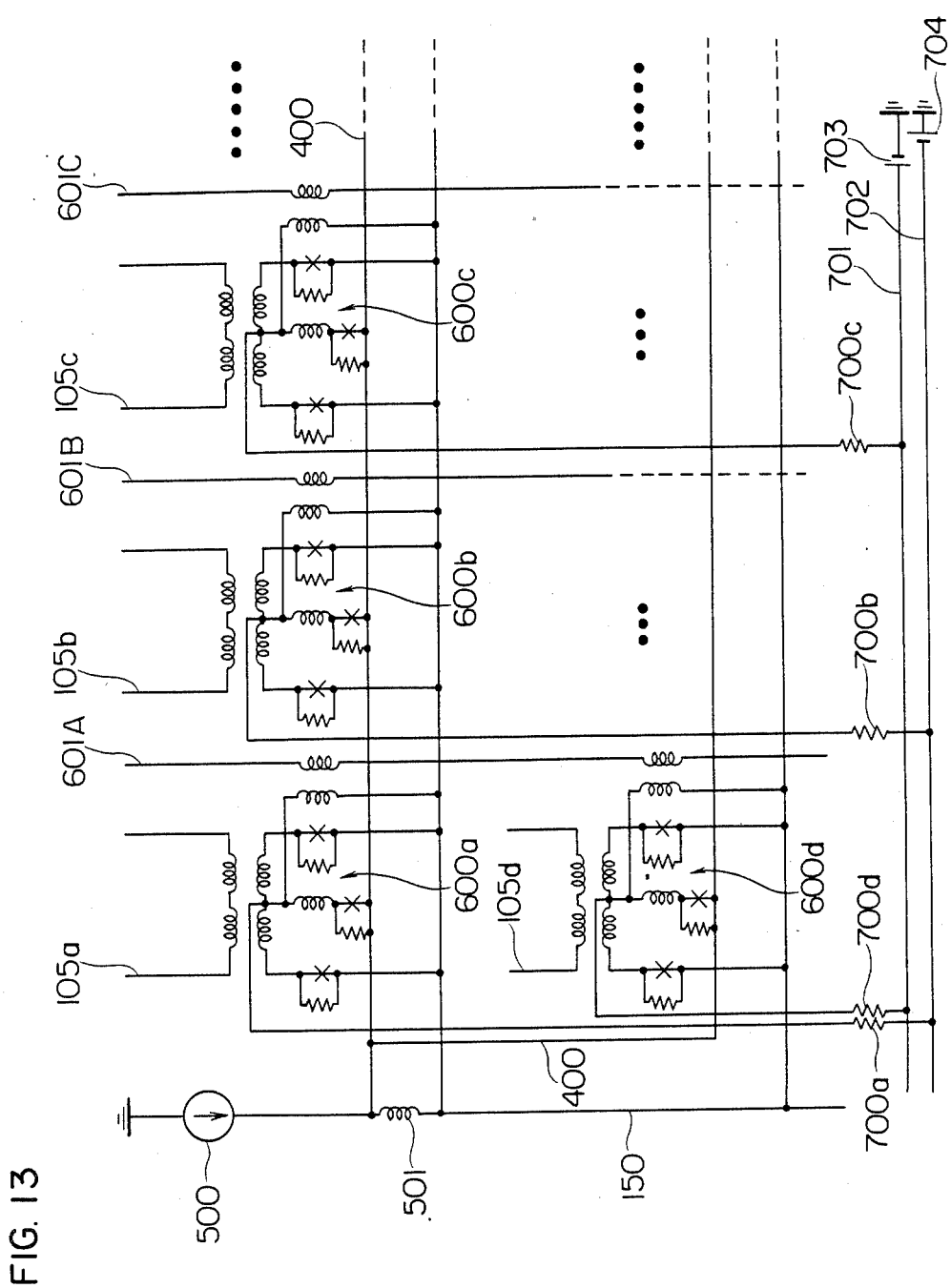
FIG. 13 is a circuit diagram showing a memory circuit according to a further embodiment of the invention in which the memory cells of the configuration shown in FIG. 11 are employed.

FIG. 13 shows a superconducting memory circuit according to another embodiment of the present invention. In the case of the instant embodiment, the memory cells of the memory circuit shown in FIG. 12 are additionally provided with offset resistors 700a, 700b, 700c, 700d and so forth, respectively, whose other ends are connected to a positive current source 703 or a negative current source 704 through offset lines 701 or 702. The memory cells 600a, ..., 600d are supplied with offset currents through the associated offset resistors 700a, ..., 700d, respectively. With the circuit configuration shown in FIG. 13, an offset current corresponding to the difference between the maximum superconducting currents of e.g. two Josephson junctions of each of the memory cells 600a, ..., 600d can flow to compensate for nonuniformity of the characteristic among the Josephson junctions. In other words, nonuniformity among the memory cells can be cancelled out, whereby a circuit having a high gain can be realized. In this conjunction, the value of the offset resistor of each memory cell and connection of the current source should be determined in dependence on the characteristics of the elements constituting each memory cell so that the current source supplying the proper offset current to the memory cell can be realized. To this end, a laser trimming technique or the like may be employed for selectively trimming the offset resistors and the connection to the positive or negative current source.

In the case of the memory circuit shown in FIG. 13, the offset resistor is used for determining the offset current. It will however be self-explanatory that inductor can be used to the same effect.

What is claimed is:

1. A superconducting switching circuit comprising:
   first and second Josephson junction elements connected in series;
   first and second excitation inductors connected in series to each other and connected in series to said first and second Josephson junction elements;
   an exciting line magnetically coupled to said first and second excitation inductors;
   a load inductor having a first end connected to a connecting point of said first and second Josephson junction elements and having a second end connected to a connecting point of said first and second excitation inductors;
   an input signal line coupled to said load inductor; and
   first and second resistors connected, respectively, to a first current path including at least said first Josephson junction element and a second current path including at least said second Josephson junction element thereby effecting suppression of unwanted resonance in the current paths, wherein said first and second current paths belonging to the circuit including said first and second Josephson elements, said first and second excitation inductors and said load inductor.

2. A superconducting switching circuit according to claim 1, wherein said first and second resistors are connected in parallel with said first and second Josephson junction elements, respectively.

3. A superconducting switching circuit according to claim 2, wherein each of said first and second Josephson junction elements comprises a first electrode, a second electrode having a first main side parallelly facing a first section of a main side of said first electrode, and an insulating film for forming a first barrier layer in contact with and being disposed between said first and second electrodes, each of said elements further comprising a third electrode having a first main side parallelly facing another section of said main side of said first electrode, and a second insulating film for forming a second barrier layer in contact with and being disposed between said first and third electrodes, said second insulating film having a sufficiently larger contact area than said first insulating film, and wherein each of said resistors comprises a fourth electrode for connecting said third electrode to said second electrode.

4. A superconducting switching circuit according to claim 1, wherein said first resistor is connected in parallel with said load inductor, said second resistor being connected in parallel with the whole or a part of the series connection of said first and second excitation inductors.

5. A memory cell comprising:
first and second Josephson junction elements connected in series to each other, first and second excitation inductors connected in series to each other and each connected in series to a respective one of said first and second Josephson junction elements, said first and second excitation inductors being magnetically coupled to a select line;
a first inductor having a first end coupled to a first connecting point of said first and second Josephson junction elements and having a second end connected to a second connecting point of said first and second excitation inductors;
a third Josephson junction element disposed between said first and second connecting points and connected in series to said first inductor;
means coupled to the serial connection of said first inductor and said third Josephson junction element for supplying a DC bias magnetic flux corresponding to a flux phase angle of $\pi$ to said serial connection; and
first, second and third resistors connected in parallel with said first, second and third Josephson junction elements, respectively, thereby effecting suppression of resonance oscillation in the current paths.

6. A memory cell according to claim 5, further including a second inductor connected in parallel with said serial connection of said first inductor and said third Josephson junction element, said second inductor being used for reading and writing of memory signals.

7. A memory cell according to claim 5, wherein said serial connection of said third Josephson junction element and said first inductor is directly connected to said first connecting point.

8. A memory cell according to claim 5, wherein said DC bias flux supplying means is disposed between said serial connection of said third Josephson junction element and said first inductor and said first junction.

9. A memory circuit comprising:
a plurality of select lines;
a plurality of data lines;
a plurality of memory cells each connected to one of said select lines and one of said data lines;
first and second lines of equal flux phase provided in common to said plurality of memory cells; and
means for supplying DC magnetic fluxes corresponding to a relative flux phase difference angle of $\pi$ to said first and second equal flux phase lines;
wherein each of said memory cells comprises:
first and second Josephson junction elements connected in series and each having an end, common to the series connected ends, for connection to said first equal flux phase line;
first and second excitation inductors connected in series to said first and second Josephson elements and connected in series to each other, said first and second excitation inductors being magnetically coupled to one of said select lines;
a serial connection of a first inductor and a third Josephson junction element, said serial connection being coupled between a connecting point of said first and second excitation inductors and said second equal flux phase line;
a second inductor coupled between the common connection of said first and second excitation inductors and said first equal flux phase line, said second inductor being magnetically coupled to one of said data lines; and
first, second and third resistors each respectively connected to a respective current path of said first, second and third Josephson junction elements.

10. A memory circuit according to claim 9, wherein said first, second and third resistors are connected in parallel with said first, second and third Josephson junction elements, respectively.

11. A memory circuit according to claim 9, further including an offset current source connected to a junction between said first and second excitation inductors in each of said memory cells for supplying an offset current corresponding to the difference in the maximum superconducting current between said first and second Josephson junction elements of each of said memory cells.

12. A composite combination comprising:
a first electrode,
a second electrode having a first main side parallelly facing a first section of a main side of said first electrode,
an insulating film for forming a barrier layer in contact with and disposed between said first and second electrodes,
a third electrode having a first main side parallelly facing another section of said main side of said first electrode,
a second insulating film in contact with and being disposed between said first and third electrodes for forming a barrier layer having a sufficiently larger contact area than said first insulating film, and
a fourth electrode for connecting said third electrode to said second electrode to serve as a resistor.

13. A superconducting switching circuit comprising:
first and second Josephson junction elements connected in series;

first and second excitation inductors connected in series to each other and connected in series to said first and second Josephson junction elements;

an exciting line magnetically coupled to said first and second excitation inductors;

a load inductor having a first end connected to a connecting point of said first and second Josephson junction elements and having a second end connected to a connecting point of said first and second excitation inductors;

an input signal line coupled to said load inductor; and first and second resistors respectively connected in parallel with said first and second Josephson junction elements, wherein first and second paths are formed in the circuit including said first and second Josephson elements in parallel with said first and second resistors, said first and second excitation inductors and said load inductor, wherein each of said first and second Josephson junction elements comprises a first electrode, a second electrode having a first main side parallelly facing a main side of said first electrode, and an insulating film for forming a first barrier layer in contact with and being disposed between said first and second electrodes, each of said elements further comprising a third electrode having a first main side parallelly facing another section of said main side of said first electrode, and a second insulating film for forming a second barrier layer in contact with and being disposed between said first and third electrodes, said second insulating film having a sufficiently larger contact area than said first insulating film, and wherein each of said resistors comprises a fourth electrode for connecting said third electrode to said second electrode.

14. A superconducting switching circuit comprising:

first and second Josephson junction elements connected in series;

first and second excitation inductors connected in series to each other and connected in series to said first and second Josephson junction elements;

an exciting line magnetically coupled to said first and second excitation inductors;

a load inductor having a first end connected to a connecting point of said first and second Josephson junction elements and having a second end connected to a connecting point of said first and second excitation inductors;

an input signal line coupled to said load inductor; and first and second resistors connected, respectively, to a first current path including at least said first Josephson junction element and a second current path including at least said second Josephson junction element, said first and second paths belonging to the circuit including said first and second Josephson elements, said first and second excitation inductors and said load inductor, wherein each of said first and second Josephson junction elements comprises a first electrode, a second electrode having a first main side parallelly facing a first section of a main side of said first electrode, and an insulating film for forming a first barrier layer in contact with and being disposed between said first and second electrodes, each of said elements further comprising a third electrode having a first main side parallelly facing another section of said main side of said first electrode, and a second insulating film for forming a second barrier layer in contact with and being disposed between said first and third electrodes, said second insulating film having a sufficiently larger contact area than said first insulating film, and wherein each of said resistors comprises a fourth electrode for connecting said third electrode to said second electrode.

15. A superconducting switching circuit comprising:

first and second Josephson junction elements connected in series;

first and second excitation inductors connected in series to each other and connected in series to said first and second Josephson junction elements;

an exciting line magnetically coupled to said first and second excitation inductors;

a load inductor having a first end connected to a connecting point of said first and second Josephson junction elements and having a second end connected to a connecting point of said first and second excitation inductors;

an input signal line coupled to said load inductor; and first and second resistors, said first resistor being connected in parallel with said load inductor and said second resistor being connected in parallel with the whole or a part of the series connection of said first and second excitation inductors.

16. A superconducting switching circuit according to claim 15, wherein said second resistor being connected in parallel with the series connection of said first and second excitation inductors.

* * * * *